(12) United States Patent
Cole

(10) Patent No.: US 12,349,319 B2
(45) Date of Patent: Jul. 1, 2025

(54) DATA CENTER HUMIDIFICATION SYSTEM

(71) Applicant: Vertiv Corporation, Columbus, OH (US)

(72) Inventor: Andrew Nathan Cole, Bellbrook, OH (US)

(73) Assignee: Vertiv Corporation, Westerville, OH (US)

( * ) Notice: Subject to any disclaimer, the term of this patent is extended or adjusted under 35 U.S.C. 154(b) by 411 days.

(21) Appl. No.: 17/736,655

(22) Filed: May 4, 2022

(65) Prior Publication Data

US 2022/0361374 A1    Nov. 10, 2022

Related U.S. Application Data

(60) Provisional application No. 63/185,266, filed on May 6, 2021.

(51) Int. Cl.
*B01F 23/21* (2022.01)
*H05K 7/20* (2006.01)

(52) U.S. Cl.
CPC ......... *H05K 7/20745* (2013.01); *B01F 23/21* (2022.01); *B01F 23/215* (2022.01)

(58) Field of Classification Search
CPC ......... B01F 23/21; B01F 23/215; B01F 3/215
See application file for complete search history.

(56) References Cited

U.S. PATENT DOCUMENTS

| 9,055,696 | B2 | 6/2015 | Dunnavant | |
| 9,404,689 | B2 * | 8/2016 | Hakbijl | B23P 15/26 |
| 10,375,862 | B2 | 8/2019 | Edge et al. | |
| 11,846,446 | B1 * | 12/2023 | Shrivastava | F24F 5/0035 |
| 2013/0176675 | A1 | 7/2013 | Hundertmark | |
| 2017/0321913 | A1 * | 11/2017 | Dinnage | F24F 13/14 |

FOREIGN PATENT DOCUMENTS

| CN | 211880877 U | 11/2020 |
| CN | 212006050 U | 11/2020 |
| CN | 212274173 U | 1/2021 |
| EP | 3314171 B1 | 4/2020 |
| JP | 2018021682 A * | 2/2018 |
| WO | 2017/117644 A1 | 7/2017 |
| WO | 2017/196739 A1 | 11/2017 |

OTHER PUBLICATIONS

International Search Report and Written Opinion dated Sep. 5, 2022 for International Application No. PCT/US2022/028168.
Pacific Gas and Electric Company: "High Performance Data Centers," Internet citation, Jan. 1, 2006 URL: http://hightech.lbl.gov/documents/DATA_CENTERS/06_DataCenters-PGE.pdf (retrieved Sep. 9, 2011, pp. 11-14.

* cited by examiner

*Primary Examiner* — Robert A Hopkins
(74) *Attorney, Agent, or Firm* — Mackey Law Firm PLLC

(57) ABSTRACT

A data center humidification system can include a housing configured to be mounted within a server cabinet, the housing having an inlet for receiving warm air and an outlet for ejecting humid air, a wetted media within the housing proximate to the inlet, a liquid delivery pipe at least partially within the housing and configured to deliver liquid to the wetted media, at least one outlet droplet trapping media within the housing proximate to the outlet, and at least one fan configured to move air through the housing.

19 Claims, 12 Drawing Sheets

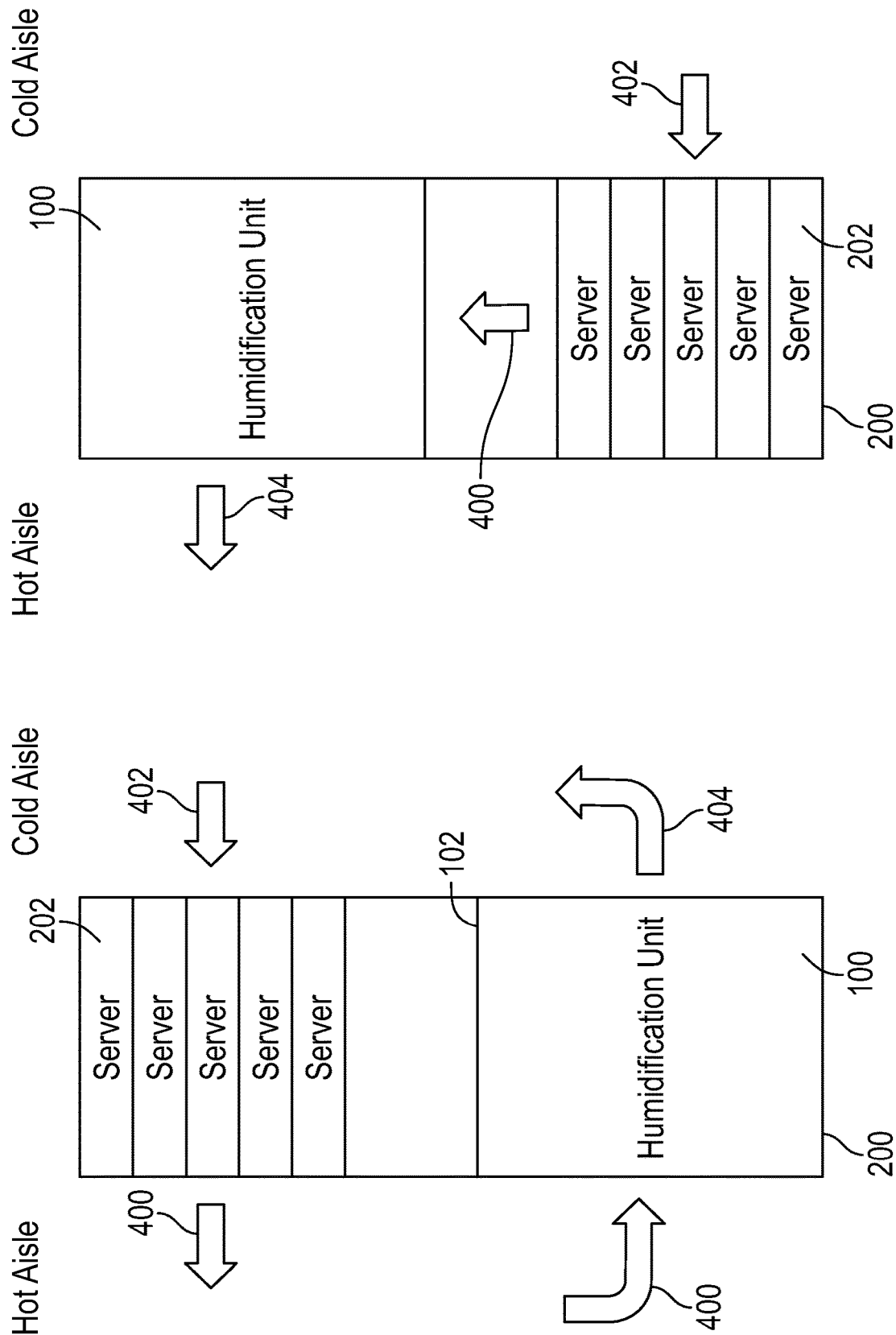

DATA CENTER HUMIDIFICATION SYSTEM

CROSS REFERENCE TO RELATED APPLICATIONS

This application claims the benefit of U.S. Provisional Patent Application No. 63/185,266 filed May 6, 2021, the entire contents of which are incorporated herein by reference.

STATEMENT REGARDING FEDERALLY SPONSORED RESEARCH OR DEVELOPMENT

Not applicable.

REFERENCE TO APPENDIX

Not applicable.

BACKGROUND OF THE INVENTION

Field of the Invention. The present disclosure relates generally to data center equipment and more specifically relates to a humidification system for use in data centers.

Description of the Related Art Some equipment in a data center may prefer certain levels of humidity. It is well understood that a typical refrigeration cycle, often used to provide cooling air to a data center, can reduce humidity. Humidity dropping below a preferred humidity can be problematic and may reduce heat transfer from heat sources within the data center.

The use of electricity to add water to the airstream of a data center can have a negative impact on power usage effectiveness (PUE) and the overall efficiency. The addition of water via electric humidification is often done using the cooled airstream. This method is inefficient due to the low mass ratio that can be applied to the already cool air which is often 20-30 degrees Fahrenheit below the dry-bulb temperature of the area in concern. There are also issues that arise from the possibility of water droplets in ducts. This often requires controls modification during the process.

A need exists in the art for improved humidification in data centers.

BRIEF SUMMARY OF THE INVENTION

Applicants have created new and useful devices, systems and methods for humidification of data centers.

In at least one embodiment, a data center humidification system can include a housing having an inlet for receiving warm air and an outlet for ejecting humid air, an inlet wetted media within the housing near the inlet, an outlet droplet trapping media within the housing near the outlet, and a fan within the housing and configured to move air through the housing. In at least one embodiment, the data center humidification system can include a liquid delivery pipe to deliver liquid to the inlet wetted media.

In at least one embodiment, the housing can be mounted to or within a server cabinet. In at least one embodiment, the housing can be less than 74 inches tall, less than 21 inches wide, and less than 44 inches deep. In at least one embodiment, the data center humidification system can include two, three, or more fans within the housing. The fan(s) can provide an air velocity within the housing of over 500 feet per minute (FPM).

In at least one embodiment, the data center humidification system can include a secondary wetted media within the housing between the inlet wetted media and the outlet droplet trapping media. In at least one embodiment, the secondary wetted media can be spaced apart from the inlet wetted media, such as by between 2 inches and 5 inches. In at least one embodiment, the data center humidification system can include a secondary delivery pipe at least partially within the housing and configured to deliver liquid to the secondary wetted media.

In at least one embodiment, the data center humidification system can include a first outlet droplet trapping media and a second outlet droplet trapping media. In at least one embodiment, the first outlet droplet trapping media and the second outlet droplet trapping media can be positioned at an angle to each other. In at least one embodiment, the angle can be from 20 degrees to 135 degrees.

In at least one embodiment, the data center humidification system can include a pump within the housing and coupled to the liquid delivery pipe and/or the secondary delivery pipe. In at least one embodiment, the pump can supply over one pound per minute of liquid flow to the liquid delivery pipe and/or the secondary delivery pipe.

In at least one embodiment, the data center humidification system can include a controller to monitor and/or control aspects of the data center humidification system. For example, in at least one embodiment, the controller can monitor pressure, temperature, and/or humidity at the inlet and/or outlet of the housing. In at least one embodiment, the controller can control the fan(s) based on at least the pressure, temperature, and/or humidity at the inlet and/or outlet of the housing. In at least one embodiment, the controller can provide one or more alarms based on at least the pressure, temperature, and/or humidity at the inlet and/or outlet of the housing.

In at least one embodiment, a data center humidification system can include a housing configured to be coupled to a server cabinet between the server cabinet and a return air duct of a cooling unit. In at least one embodiment, the housing can include an inlet for receiving warm air from the server cabinet and an outlet for ejecting humid air into the return air duct. In at least one embodiment, a data center humidification system can include an inlet wetted media within the housing near the inlet and a droplet trapping media within the housing near the outlet. In at least one embodiment, a data center humidification system can include a liquid delivery pipe at least partially within the housing to deliver liquid to the inlet wetted media. In at least one embodiment, a data center humidification system can include a fan within the housing to move air through the housing.

BRIEF DESCRIPTION OF THE SEVERAL VIEWS OF THE DRAWINGS

FIG. 10 is a simplified block diagram of another of many embodiments of a data center humidification system according to the disclosure.

FIG. 11 is a simplified block diagram of another of many embodiments of a data center humidification system according to the disclosure.

DETAILED DESCRIPTION OF THE INVENTION

Figure 1:
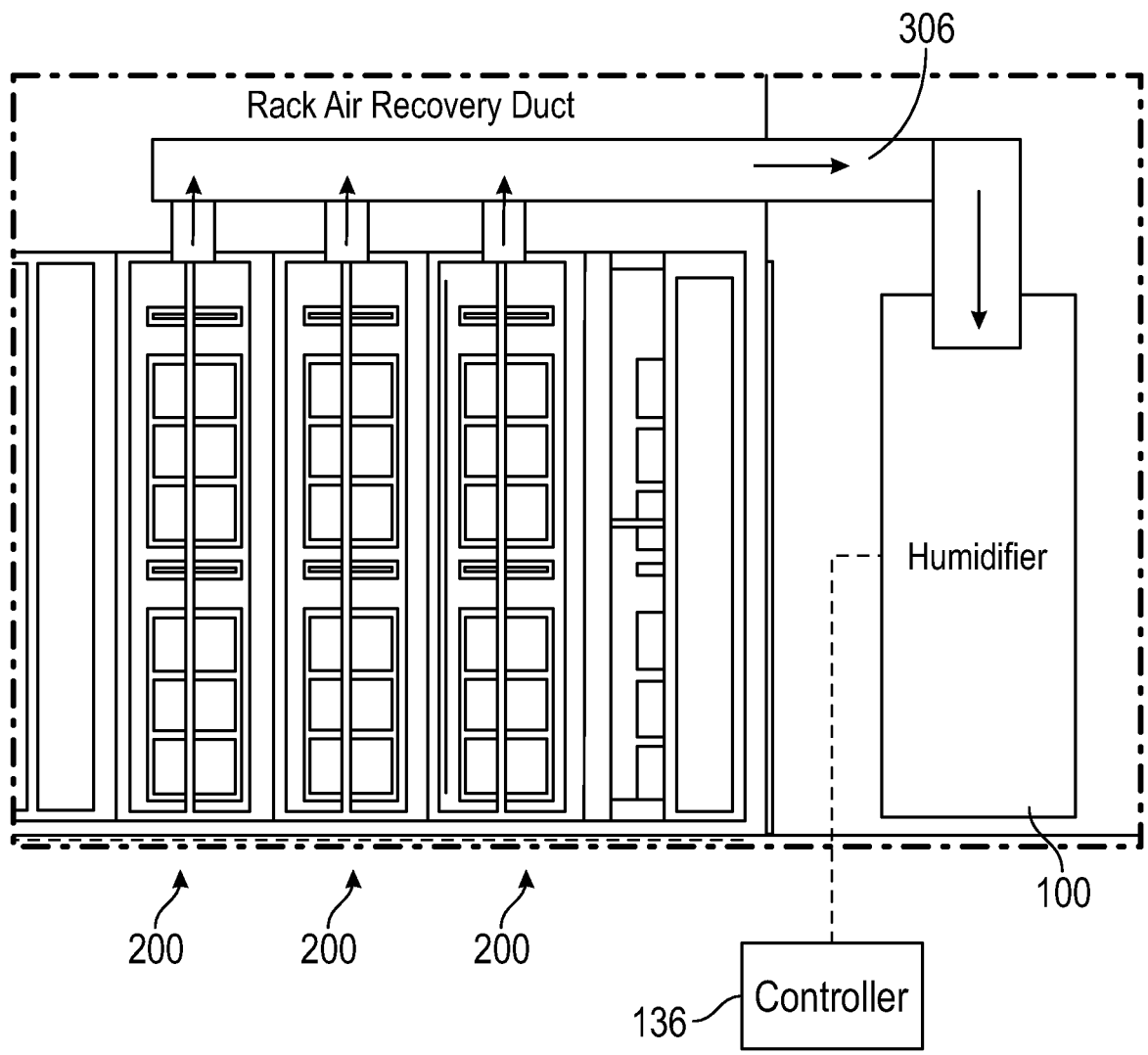
FIG. 1 is a simplified block diagram of one of many embodiments of a data center humidification system according to the disclosure.

The Figures described above and the written description of specific structures and functions below are not presented to limit the scope of what Applicants have invented or the scope of the appended claims. Rather, the Figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present disclosure will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms.

The use of a singular term, such as, but not limited to, "a," is not intended as limiting of the number of items. Also, the use of relational terms, such as, but not limited to, "top," "bottom," "left," "right," "upper," "lower," "down," "up," "side," and the like are used in the written description for clarity in specific reference to the Figures and are not intended to limit the scope of the inventions or the appended claims. The terms "including" and "such as" are illustrative and not limitative. The terms "couple," "coupled," "coupling," "coupler," and like terms are used broadly herein and can include any method or device for securing, binding, bonding, fastening, attaching, joining, inserting therein, forming thereon or therein, communicating, or otherwise associating, for example, mechanically, magnetically, electrically, chemically, operably, directly or indirectly with intermediate elements, one or more pieces of members together and can further include without limitation integrally forming one functional member with another in a unity fashion. The coupling can occur in any direction, including rotationally. Further, all parts and components of the disclosure that are capable of being physically embodied inherently include imaginary and real characteristics regardless of whether such characteristics are expressly described herein, including but not limited to characteristics such as axes, ends, inner and outer surfaces, interior spaces, tops, bottoms, sides, boundaries, dimensions (e.g., height, length, width, thickness), mass, weight, volume and density, among others.

Figure 2:
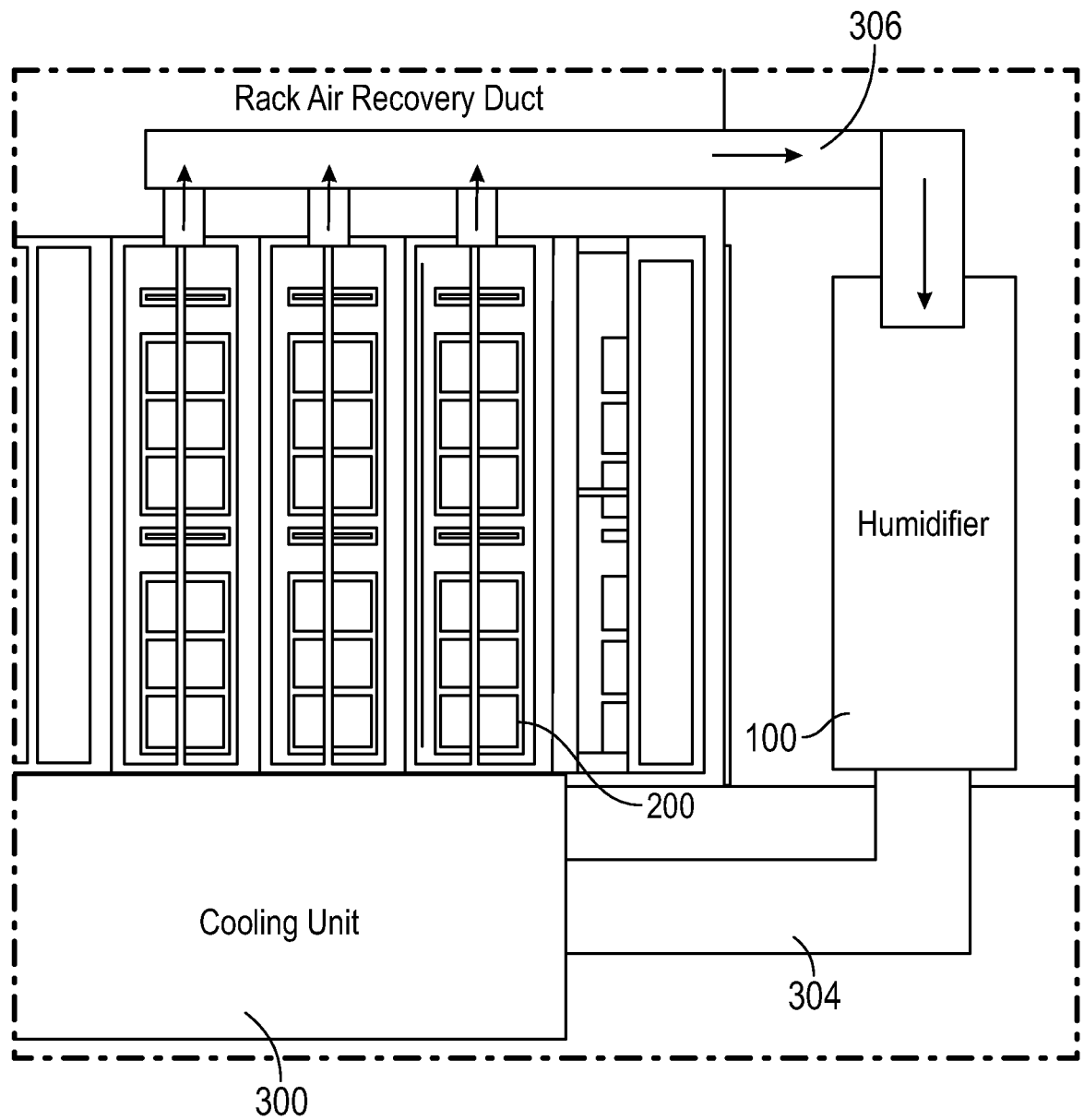
FIG. 2 is a simplified block diagram of another of many embodiments of a data center humidification system according to the disclosure.
Figure 3:
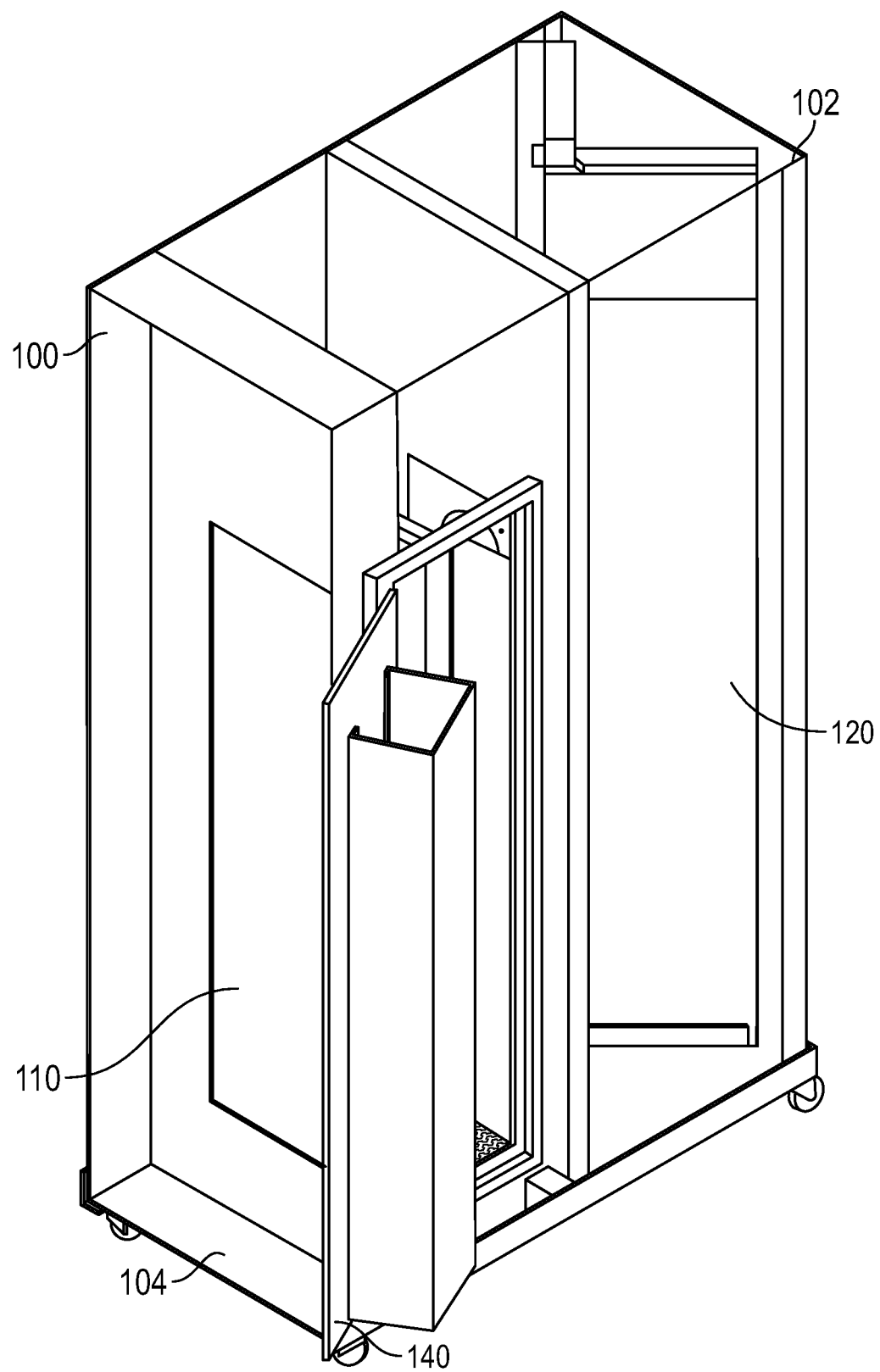
FIG. 3 is a perspective view of one of many embodiments of a data center humidification system according to the disclosure.
Figure 4:
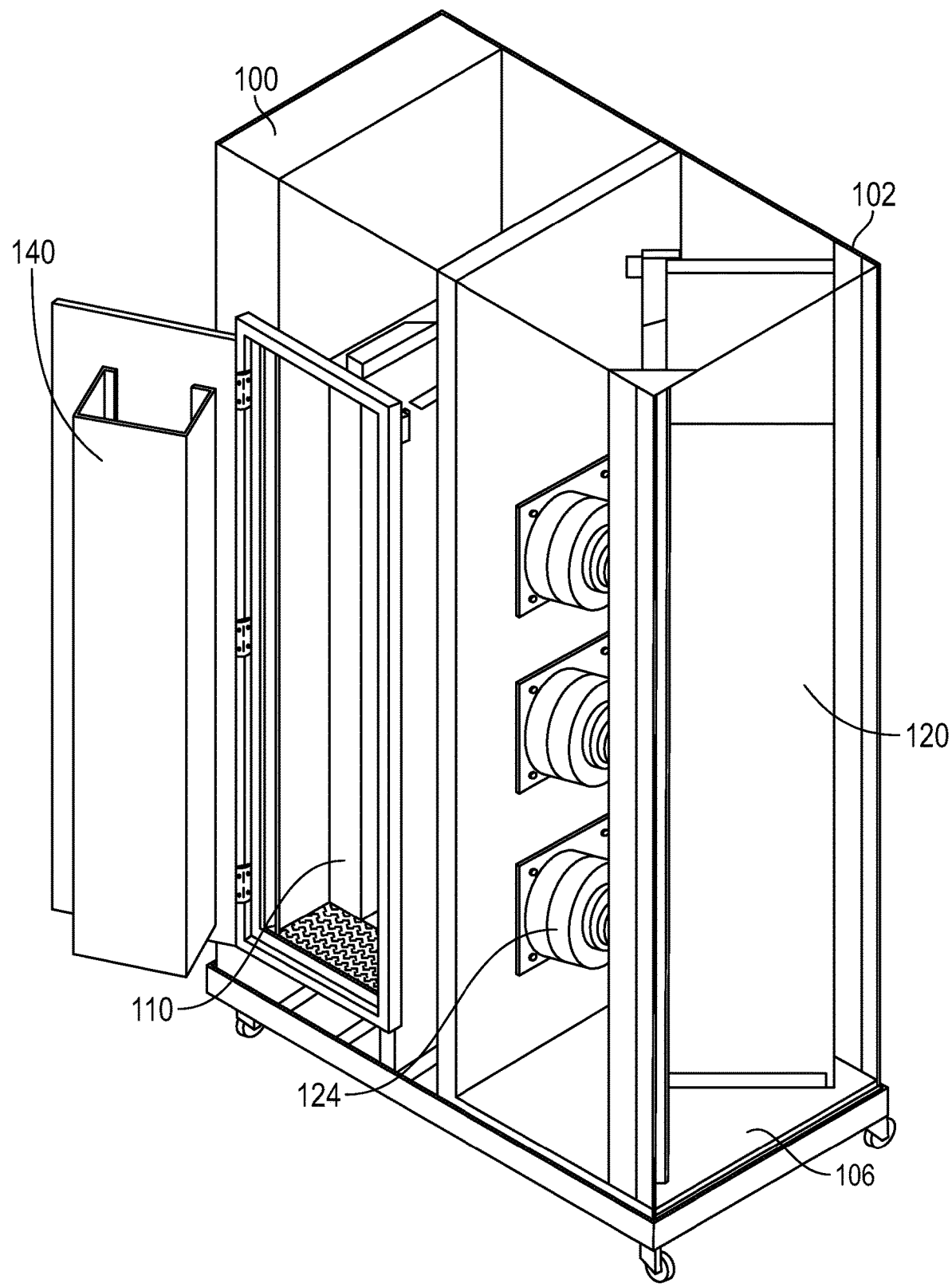
FIG. 4 is a perspective view of another of many embodiments of a data center humidification system according to the disclosure.
Figure 5:
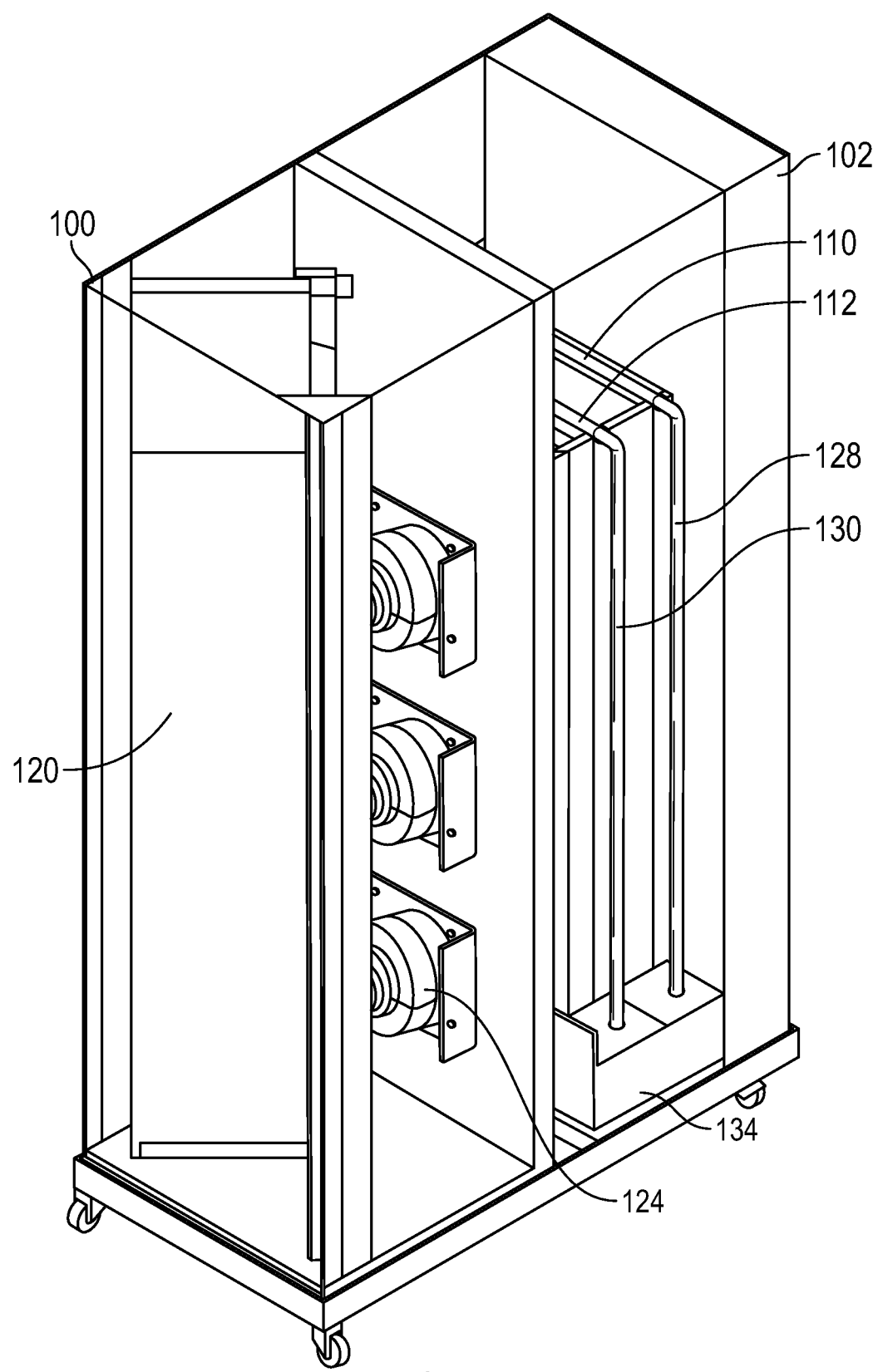
FIG. 5 is a perspective view of yet another of many embodiments of a data center humidification system according to the disclosure.
Figure 6:
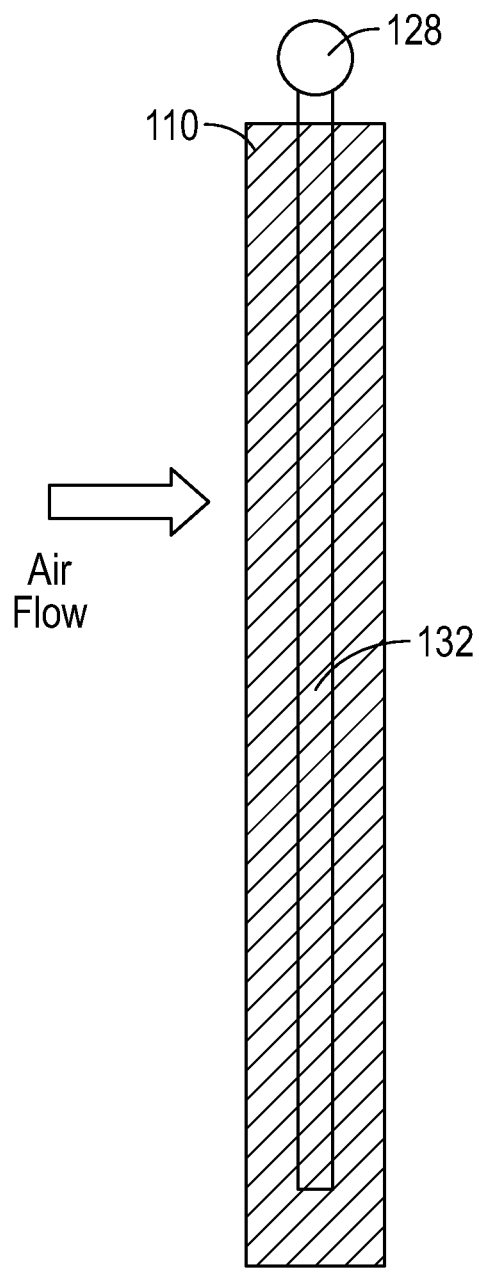
FIG. 6 is a side elevation view of one of many embodiments of a wetted media for use with a data center humidification system according to the disclosure.
Figure 7:
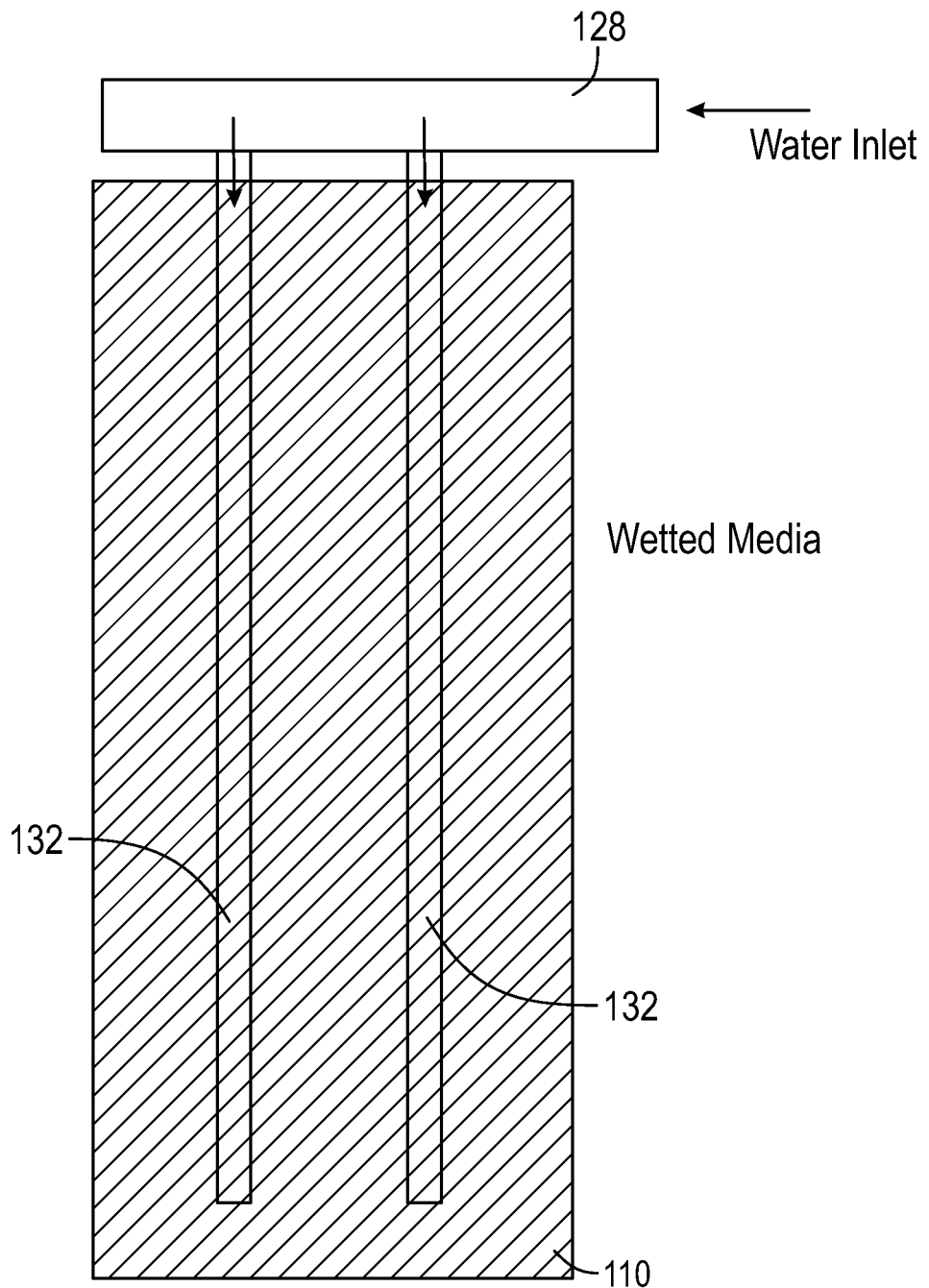
FIG. 7 is a front elevation view of one of many embodiments of a wetted media for use with a data center humidification system according to the disclosure.
Figure 8:
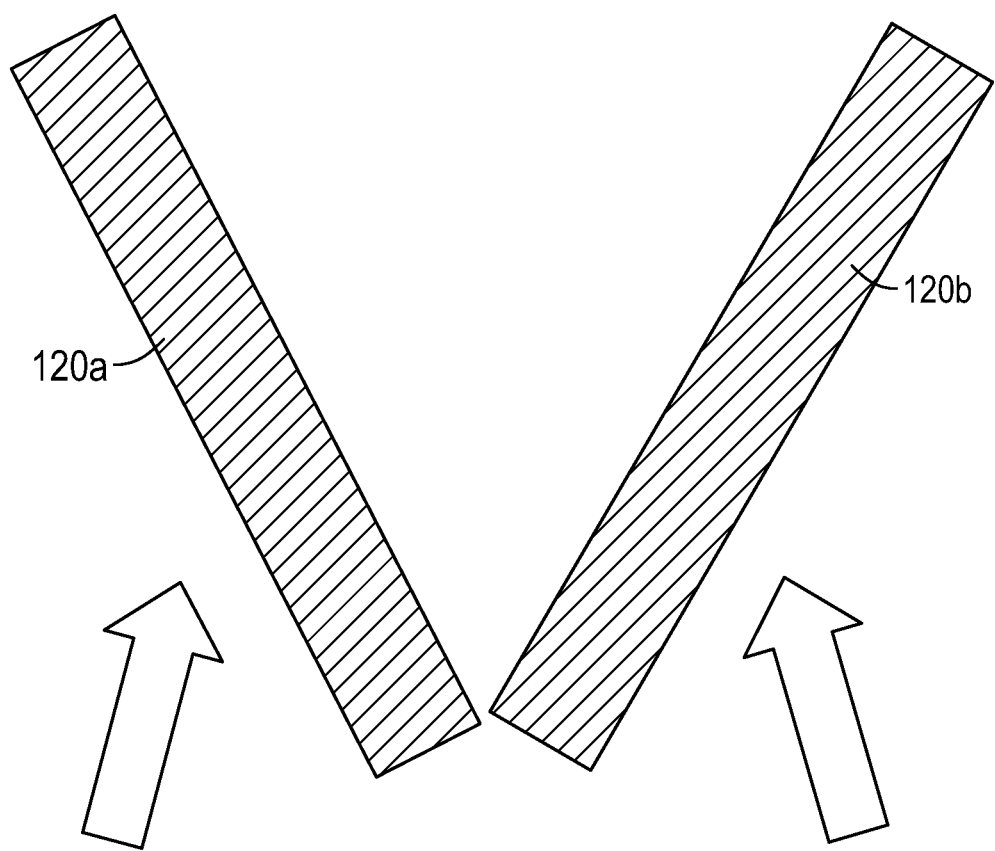
FIG. 8 is a top plan view of one of many embodiments of a droplet trapping media for use with a data center humidification system according to the disclosure.
Figure 9:
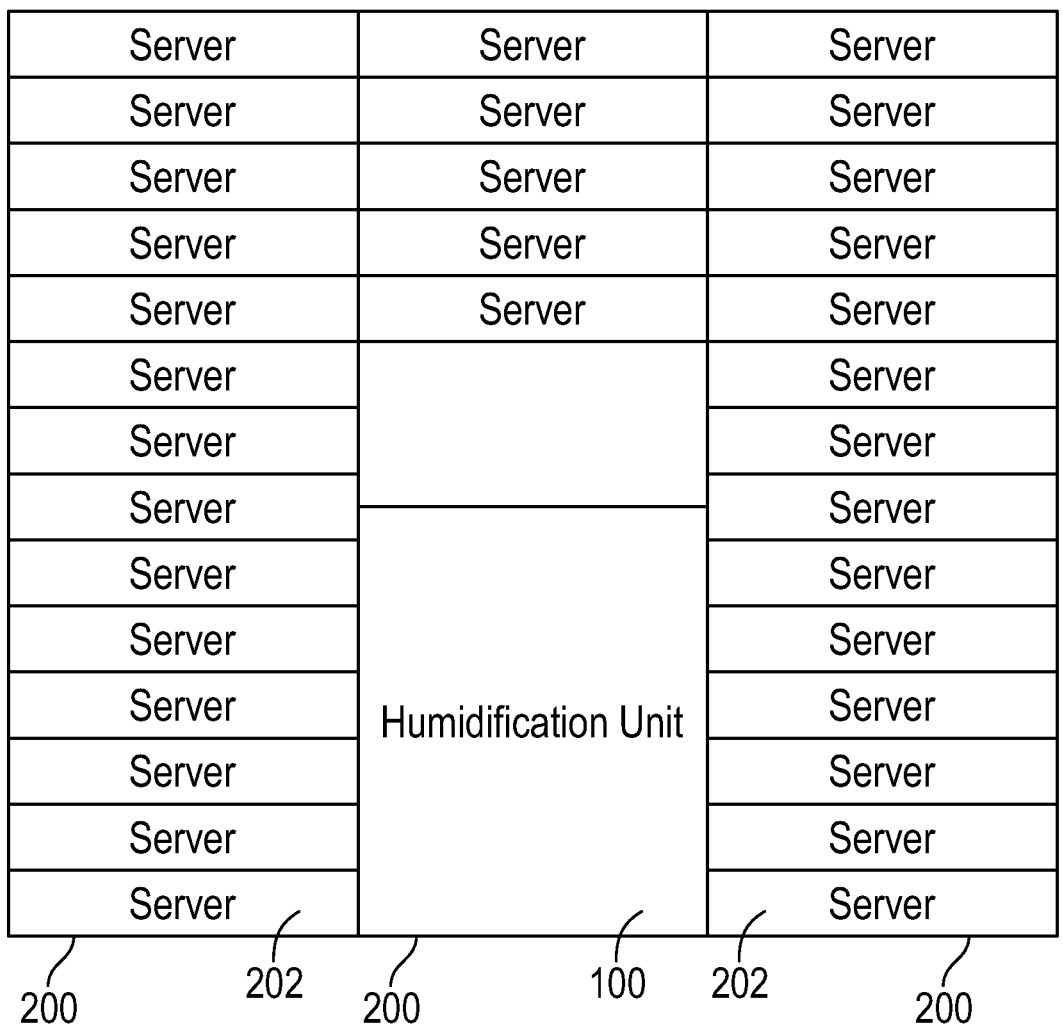
FIG. 9 is a simplified block diagram of one of many embodiments of a data center humidification system according to the disclosure.
Figure 12:
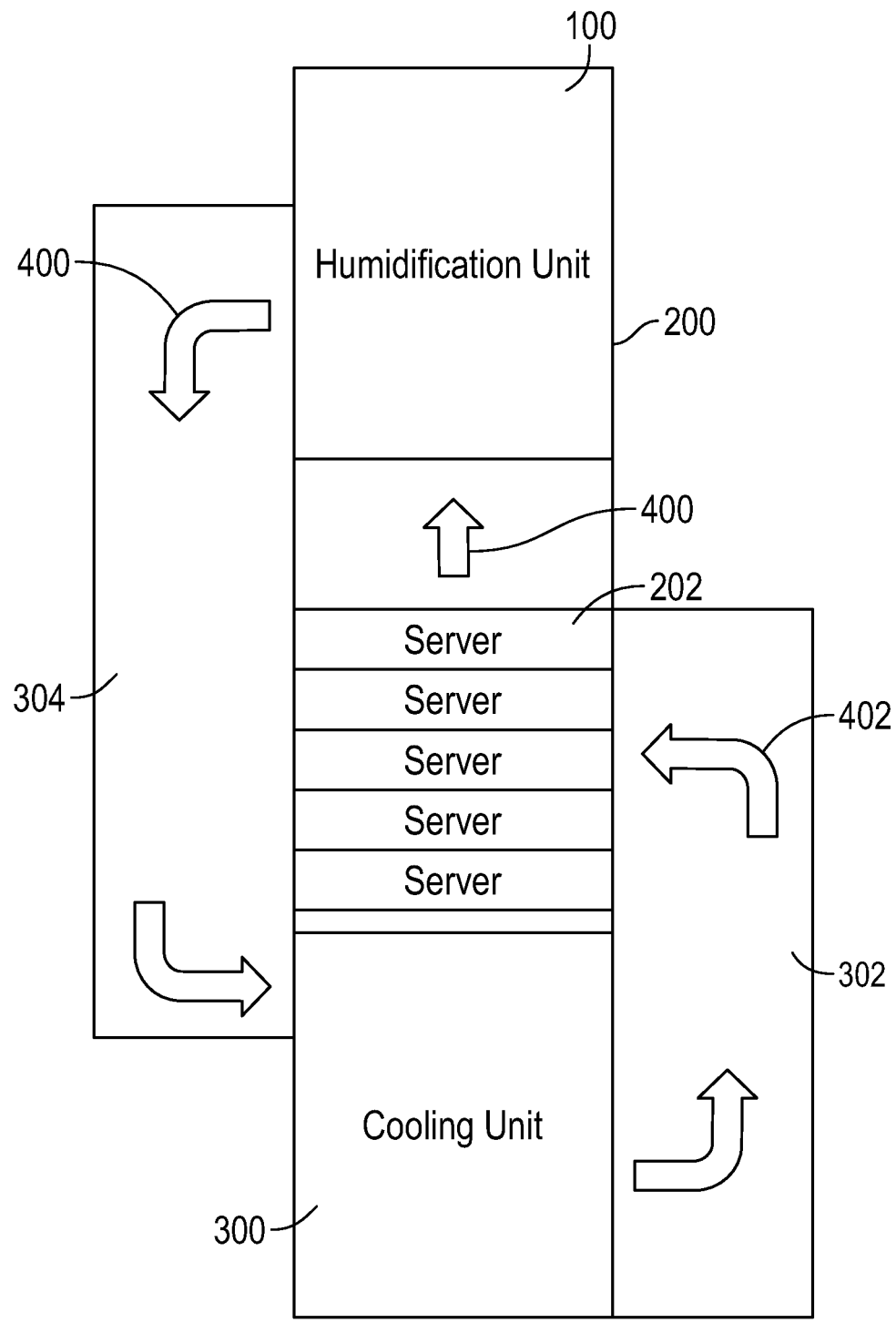
FIG. 12 is a simplified block diagram of another of many embodiments of a data center humidification system according to the disclosure.
Figure 13:
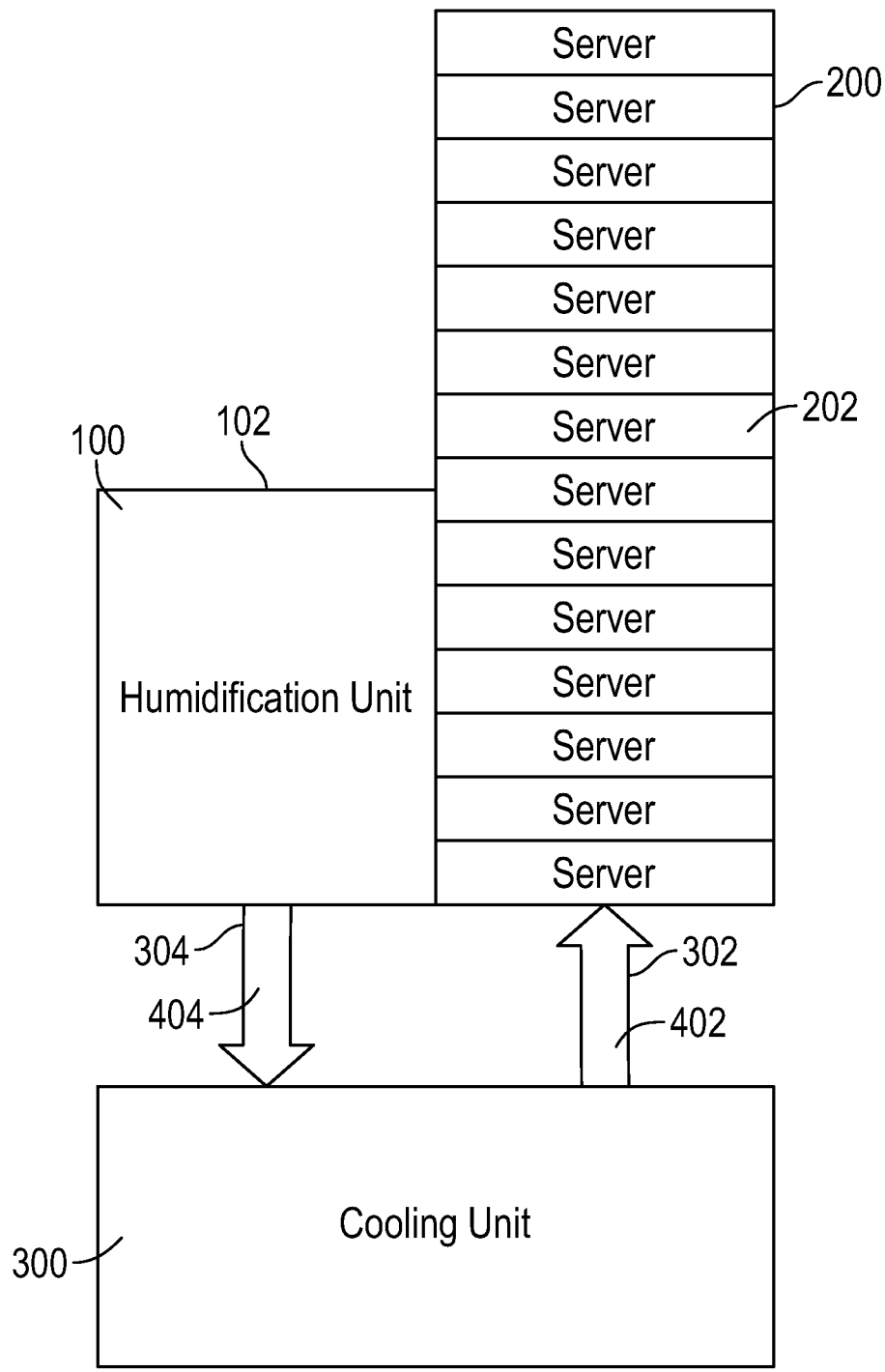
FIG. 13 is a simplified block diagram of another of many embodiments of a data center humidification system according to the disclosure.

FIG. 1 is a simplified block diagram of one of many embodiments of a data center humidification system according to the disclosure. FIG. 2 is a simplified block diagram of another of many embodiments of a data center humidification system according to the disclosure. FIG. 3 is a perspective view of one of many embodiments of a data center humidification system according to the disclosure. FIG. 4 is a perspective view of another of many embodiments of a data center humidification system according to the disclosure. FIG. 5 is a perspective view of yet another of many embodiments of a data center humidification system according to the disclosure. FIG. 6 is a side elevation view of one of many embodiments of a wetted media for use with a data center humidification system according to the disclosure. FIG. 7 is a front elevation view of one of many embodiments of a wetted media for use with a data center humidification system according to the disclosure. FIG. 8 is a top plan view of one of many embodiments of a droplet trapping media for use with a data center humidification system according to the disclosure. FIG. 9 is a simplified block diagram of one of many embodiments of a data center humidification system according to the disclosure. FIG. 10 is a simplified block diagram of another of many embodiments of a data center humidification system according to the disclosure. FIG. 11 is a simplified block diagram of another of many embodiments of a data center humidification system according to the disclosure. FIG. 12 is a simplified block diagram of another of many embodiments of a data center humidification system according to the disclosure. FIG. 13 is a simplified block diagram of another of many embodiments of a data center humidification system according to the disclosure. FIGS. 1-13 will be described in conjunction with one another.

Applicants have created new and useful devices, systems and methods for humidification of data centers and other high density cooling applications.

In at least one embodiment, a data center humidification system can include a housing having an inlet for receiving warm air and an outlet for ejecting humid air, an inlet wetted media within the housing near the inlet, an outlet droplet trapping media within the housing near the outlet, and a fan within the housing and configured to move air through the housing. In at least one embodiment, the data center humidification system can include a liquid delivery pipe to deliver liquid to the inlet wetted media.

In at least one embodiment, the housing can be mounted to or within a server cabinet. In at least one embodiment, the housing can be less than 74 inches tall, less than 21 inches wide, and less than 44 inches deep. In at least one embodiment, the data center humidification system can include two, three, or more fans within the housing. The fan(s) can provide an air velocity within the housing of over 500 feet per minute (FPM).

In at least one embodiment, the data center humidification system can include a secondary wetted media within the housing between the inlet wetted media and the outlet droplet trapping media. In at least one embodiment, the secondary wetted media can be spaced apart from the inlet wetted media, such as by between 2 inches and 5 inches. In at least one embodiment, the data center humidification system can include a secondary delivery pipe at least partially within the housing and configured to deliver liquid to the secondary wetted media.

In at least one embodiment, the data center humidification system can include a first outlet droplet trapping media and a second outlet droplet trapping media. In at least one embodiment, the first outlet droplet trapping media and the second outlet droplet trapping media can be positioned at an angle to each other. In at least one embodiment, the angle can be from 20 degrees to 135 degrees.

In at least one embodiment, the data center humidification system can include a pump within the housing and coupled to the liquid delivery pipe and/or the secondary delivery pipe. In at least one embodiment, the pump can supply over one pound per minute of liquid flow to the liquid delivery pipe and/or the secondary delivery pipe.

In at least one embodiment, the data center humidification system can include one or more controllers to monitor and/or control aspects of the data center humidification system. For example, in at least one embodiment, the controller can monitor pressure, temperature, and/or humidity at the inlet and/or outlet of the housing. In at least one embodiment, the controller can control the fan(s) based on at least the pressure, temperature, and/or humidity at the inlet and/or outlet of the housing. In at least one embodiment, the controller can provide one or more alarms based on at least the pressure, temperature, and/or humidity at the inlet and/or outlet of the housing. In at least one embodiment, one or more controllers can be standalone for the system or a part of the system. In at least one embodiment, one or more controllers can be configured to cooperate with one another and/or with multiple system components (e.g., cooling units, humidifiers) for monitoring and/or otherwise controlling aspects of all or part(s) of the system.

In at least one embodiment, a data center humidification system can include a housing configured to be coupled to a server cabinet between the server cabinet and a return air duct of a cooling unit. In at least one embodiment, the housing can include an inlet for receiving warm air from the server cabinet and an outlet for ejecting humid air into the return air duct. In at least one embodiment, a data center humidification system can include an inlet wetted media within the housing near the inlet and a droplet trapping media within the housing near the outlet. In at least one embodiment, a data center humidification system can include liquid delivery pipe at least partially within the housing to deliver liquid to the inlet wetted media. In at least one embodiment, a data center humidification system can include a fan within the housing to move air through the housing.

In at least one embodiment, a data center humidification system 100 can include a housing 102 having an inlet 104 for receiving warm air, such as from servers, and an outlet 106 for ejecting humid air. In at least one embodiment, the housing 102 can be mounted to or within a server cabinet 200. In at least one embodiment, the housing can be less than 74 inches tall, less than 21 inches wide, and less than 44 inches deep. In at least one embodiment, the housing can be approximately 73¾ inches tall, approximately 20 inches wide, and approximately 43 inches deep.

In at least one embodiment, the data center humidification system 100 can include an inlet wetted media 110 within the housing 102 near the inlet 104. In at least one embodiment, the data center humidification system 100 can include a secondary wetted media 112 within the housing 102 between the inlet wetted media 110 and the outlet 106. In at least one embodiment, the secondary wetted media 112 can be spaced apart from the inlet wetted media 110, such as by between 2 inches and 5 inches. In at least one embodiment, the secondary wetted media 112 can be spaced apart from the inlet wetted media 110 by approximately 3 inches. In at least one embodiment, the secondary wetted media 112 can be spaced apart from the inlet wetted media 110 by 3 inches. In at least one embodiment, the spacing between the inlet wetted media 110 and the secondary wetted media 112 can be used to balance pressures in the media, and can improve overall effectiveness.

In at least one embodiment, the inlet wetted media 110 can be approximately 12 inches wide, approximately 4 inches thick, and approximately 48 inches tall. In at least one embodiment, the inlet wetted media 110 can be 12 inches wide, 4 inches thick, and 48 inches tall. In at least one embodiment, the secondary wetted media 112 can be approximately 12 inches wide, approximately 4 inches thick, and approximately 48 inches tall. In at least one embodiment, the secondary wetted media 112 can be 12 inches wide, 4 inches thick, and 48 inches tall. But, in at least one embodiment, the inlet wetted media 110 and the secondary wetted media 112 are not required to be the same size.

In at least one embodiment, a data center humidification system 100 can include an outlet droplet trapping media 120 within the housing 102 near the outlet 106. In at least one embodiment, the data center humidification system 100 can include a first outlet droplet trapping media 120a and a second outlet droplet trapping media 120b. In at least one embodiment, the first outlet droplet trapping media 120a and the second outlet droplet trapping media 120b can be positioned at an angle to each other. In at least one embodiment, the angle can be from 20 degrees to 135 degrees. In at least one embodiment, the angle can be approximately 30 degrees. In at least one embodiment, the outlet droplet trapping media 120 can be approximately 12 inches wide, approximately 2 inches thick, and approximately 60 inches tall. In at least one embodiment, the outlet droplet trapping media 120 can be 12 inches wide, 2 inches thick, and 60 inches tall. But, in at least one embodiment, the first outlet droplet trapping media 120a and the second outlet droplet trapping media 120b are not required to be the same size. In at least one embodiment, the outlet droplet trapping media 120 slows air flow though the housing 102 and catches free stream droplets.

In at least one embodiment, a data center humidification system 100 can include a fan 124 within the housing 102 and configured to move air through the housing 102. In at least one embodiment, the data center humidification system 100 can include two, three, or more fans 124 within the housing 102. In at least one embodiment, the fan(s) 124 can provide an air velocity within the housing 102 of over 500 feet per minute. In at least one embodiment, the fan(s) 124 can provide an air velocity within the housing 102 of approximately 700 feet per minute. In at least one embodiment, the fan(s) 124 can provide an air velocity within the housing 102 of 700 feet per minute. In at least one embodiment, the fan(s) 124 can provide an air volume through the housing 102 of over 2000 cubic feet per minute (CFM). In at least one embodiment, the fan(s) 124 can provide an air volume through the housing 102 of approximately 2100 CFM. In at least one embodiment, the fan(s) 124 can provide an air volume through the housing 102 of 2100 CFM.

In at least one embodiment, the fan(s) 124 can be mounted between the inlet 104 and the outlet 106. In at least one embodiment, the fan(s) 124 can be mounted within the inlet 104. In at least one embodiment, the fan(s) 124 can be mounted within the outlet 106. In at least one embodiment, the fan(s) 124 can be mounted between the inlet wetted media 110 and the outlet droplet trapping media 120.

In at least one embodiment, the data center humidification system 100 can include a liquid delivery pipe 128 to deliver liquid, such as water and/or select chemicals, elements, compounds, etc., to the inlet wetted media 110. In at least one embodiment, the liquid delivery pipe 128 can be mounted at least partially within the housing 102. In at least one embodiment, the liquid delivery pipe 128 can be mounted entirely within the housing 102. In at least one embodiment, the liquid delivery pipe 128 can include one or more perforated pipes 132 within the inlet wetted media 110. In at least one embodiment, the liquid delivery pipe 128 can include two perforated pipes 132 through a center of the inlet wetted media 110. In at least one embodiment, the perforated pipe(s) 132 can have a diameter of approximately ¼ inch. In at least one embodiment, the perforated pipe(s) 132 can have a diameter of ¼ inch. In at least one embodiment, the perforated pipe(s) 132 can have a diameter of approximately ⅜ inch. In at least one embodiment, the perforated pipe(s) 132 can have a diameter of ⅜ inch.

In at least one embodiment, the data center humidification system 100 can include a secondary delivery pipe 130 at least partially within the housing 102 and configured to deliver liquid to the secondary wetted media 112. In at least one embodiment, the secondary delivery pipe 130 can be identical to the liquid delivery pipe 128, but with respect to the secondary wetted media 112. In at least one embodiment, the secondary delivery pipe 130 is not required to be identical to the liquid delivery pipe 128.

In at least one embodiment, the data center humidification system 100 can include one or more pump(s) 134 within the housing 102 and coupled to the liquid delivery pipe 128 and/or the secondary delivery pipe 130. In at least one embodiment, the pump(s) 134 can supply over one pound per minute of liquid flow to the liquid delivery pipe 128 and/or the secondary delivery pipe 130. In at least one embodiment, the pump(s) 134 can supply between one and two pounds per minute of liquid flow to the liquid delivery pipe 128 and/or the secondary delivery pipe 130. In at least one embodiment, the pump(s) 134 can supply one pound per minute of liquid flow to the liquid delivery pipe 128 and/or the secondary delivery pipe 130. In at least one embodiment, the pump(s) 134 can supply one and one half pounds per minute of liquid flow to the liquid delivery pipe 128 and/or the secondary delivery pipe 130. In at least one embodiment, the pump(s) 134 can supply two pounds per minute of liquid flow to the liquid delivery pipe 128 and/or the secondary delivery pipe 130.

In at least one embodiment, the data center humidification system 100 can include one or more controllers 136 to monitor and/or control aspects of the data center humidification system 100. For example, in at least one embodiment, the controller 136 can monitor pressure, temperature, and/or humidity at the inlet 104 and/or outlet 106 of the housing 102, such as in cooperation with one or more sensors (not shown) operably coupled with controller 136. In at least one embodiment, the controller 136 can control the fan(s) 124 based on at least the pressure, temperature, and/or humidity at the inlet 104 and/or outlet 106 of the housing 102. In at least one embodiment, the controller 136 can provide one or more alarms based on at least the pressure, temperature, and/or humidity at the inlet 104 and/or outlet 106 of the housing 102. For example, in at least one embodiment, the controller 136 can control the speed of the fan(s) 124 and/or the pump(s) 134 to obtain the desired temperature and/or humidity at the outlet 106. Such speed settings can depend on the temperature and/or humidity at the inlet 104. In at least one embodiment, the controller 136 can provide an alarm if a pressure differential between the inlet 104 and outlet 106 exceeds a threshold. In at least one embodiment, one or more controllers 136 can be standalone for the system 100 or a part of the system 100. In at least one embodiment, one or more controllers 136 can be configured to cooperate with one another and/or with multiple systems 100 or other components (e.g., cooling units, humidifiers, pumps, sensors) for monitoring and/or otherwise controlling aspects of all or part(s) of the system(s).

In at least one embodiment, a data center humidification system 100 can include a liquid sump (not shown) to catch any droplets from other components, such as the inlet wetted media 110, the secondary wetted media 112, the outlet droplet trapping media 120, and/or leaking plumbing. In at least one embodiment, the pump(s) 134 can draw water from the sump and/or a supply line.

In at least one embodiment, a data center humidification system 100 can include an access door 140 to provide access to the inlet wetted media 110, the secondary wetted media 112, the outlet droplet trapping media 120, the fan(s) 124, the pump(s) 134 and/or other components of the system 100, such as for inspection, maintenance, repair, and/or replacement.

In at least one embodiment, a data center humidification system 100 can include a housing 102 configured to be coupled to a server cabinet 200 between the server cabinet 200 and a return air duct 304 of a cooling unit 300. In at least one embodiment, the housing 102 can include an inlet 102 for receiving warm air 400 from the server cabinet 200 and an outlet 106 for ejecting humid air 404 into the return air duct 304. In at least one embodiment, a data center humidification system 100 can include an inlet wetted media 110 within the housing 102 near the inlet 104 and a droplet trapping media 120 within the housing 102 near the outlet 106. In at least one embodiment, a data center humidification system 100 can include a liquid delivery pipe 128 at least partially within the housing 102 to deliver liquid to the inlet wetted media 110. In at least one embodiment, a data center humidification system 100 can include a fan 124 within the housing 102 to move air through the housing 102.

It should be understood that servers 202 within the server cabinet 200 produce heat and thereby the warm air 400. In at least one embodiment, the warm air 400 can be ejected by the server cabinet 200 into the room, such as into a hot aisle. In at least one embodiment, the warm air 400 can be ejected by the server cabinet 200 directly into the housing 102 of the data center humidification system 100. In at least one embodiment, the warm air 400 can be ejected by the server cabinet 200 into the housing 102 of the data center humidification system 100 via a warm air duct 306.

In at least one embodiment, a data center humidification system 100 receives the warm air 400 through the inlet 104 of the housing 102 and ejects humid air 404 from the outlet 106 of the housing 102. In at least one embodiment, the warm air 400 can be received from the room, such as the hot aisle. In at least one embodiment, the warm air 400 can be received directly from the server cabinet 200. In at least one embodiment, the warm air 400 can be received from the server cabinet 200 via a warm air duct 306. In at least one embodiment, the humid air 404 can be ejected into a return air duct 304 that leads to a cooling unit 300. In at least one embodiment, the humid air 404 can be ejected directly into the cooling unit 300. In at least one embodiment, the humid air 404 can be ejected into the room, such as into a cold aisle, where it mixes with cool air 402 from the cooling unit 300, raising the humidity of the cool air 402.

It should also be understood that the cooling unit 300 receives the humid air 404 and/or the warm air 400 and ejects the cool air 402 to cool the servers 202 in the server cabinet 200. In at least one embodiment, the warm air 400 can be received from the room, such as from the hot aisle. In at least one embodiment, the humid air 404 can be received from the return air duct 306. In at least one embodiment, the humid air 404 can be received directly from the system 100. In at least one embodiment, the cool air 402 can be ejected into the room, such as into the cold aisle. In at least one embodiment, the cool air 402 can be ejected into a cool air duct 302 where it can be routed to the server cabinet(s) 200. In at least one embodiment, the cool air 402 can be ejected directly into the server cabinet(s) 200.

It can be seen that the data center humidification systems 100 of the present disclosure can be mounted in a cabinet 200 next to other cabinets 200 containing servers 202. In at least one embodiment, the data center humidification systems 100 of the present disclosure can be mounted in a cabinet 200 containing servers 202. In at least one embodiment, the data center humidification systems 100 of the present disclosure can be mounted in a cabinet 200 containing servers 202 below those servers 202. In at least one embodiment, the data center humidification systems 100 of the present disclosure can be mounted in a cabinet 200 containing servers 202 above those servers 202. In at least one embodiment, the data center humidification systems 100 of the present disclosure can be mounted in a cabinet 200 containing servers 202 between those servers 202.

It can be seen that the data center humidification systems of the present disclosure can use heat from the servers to humidify the air, rather than additional heat sources, which can be more efficient than conventional systems and can provide high levels of localized cooling. By using the heat from the servers, the data center humidification systems of the present disclosure require less fan energy and less air velocity to evaporate the water. By locating humidification near the point of use, such as near the servers, the data center humidification systems of the present disclosure reduce water waste and reduce condensing requirements of perimeter units. By not attempting to humidify the cooling air, from the cooling unit, there can be less risk of condensation in ducts and/or under floors.

As will be appreciated by those skilled in the art having the benefits of the present disclosure, aspects of one or more embodiments of the disclosure can be embodied as a system, method or computer program product. Accordingly, aspects of the present embodiments can take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more non-transitory computer readable medium(s) having computer readable program code embodied thereon. Any combination of one or more computer readable media may be utilized. The computer readable media may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples of such computer readable storage media include but are not limited to the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium or media, including but not limited to wireless, wireline, optical fiber cable, RF, etc., or any suitable combination of the foregoing. Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on a user's computer, partly on a user's computer, as a stand-alone software package, partly on a user's computer and partly on a remote computer or entirely on a remote computer or server. In the latter scenario, the remote computer may be connected to a user's computer through any type of network, including a local area network (LAN) or a wide area network (WAN), or the connection may be made to an external computer (for example, through the Internet using an Internet Service Provider or via a short-range wireless interconnection such as Bluetooth).

Aspects of the present disclosure can be described with reference to flowchart illustrations and/or block diagrams of methods, apparatuses (devices and systems) and computer program products according to embodiments of the disclosure. Each block of a flowchart illustration and/or block diagram, and combinations of blocks in a flowchart illustration and/or block diagrams, can be implemented by computer program instructions. These computer program instructions may be provided to a processor of a general purpose computer, special purpose computer, or other programmable data processing apparatus to produce a machine, such that the instructions, which executed via one or more processors, create means for implementing the functions/acts specified in the flowchart and/or block diagram block or blocks. The computer program instructions can be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in a flowchart and/or block diagram block or blocks. Each block in a flowchart and/or block diagram can be split into multiple blocks and/or combined with other blocks to make a single block.

In at least one embodiment, a data center humidification system can include a housing configured to be mounted within a server cabinet, the housing having an inlet for receiving warm air and an outlet for ejecting humid air, an inlet wetted media within the housing proximate to the inlet, a liquid delivery pipe at least partially within the housing and configured to deliver liquid to the inlet wetted media, at least one outlet droplet trapping media within the housing proximate to the outlet, and at least one fan within the housing and configured to move air through the housing.

In at least one embodiment, the housing can be less than 74 inches tall, less than 21 inches wide, and less than 44 inches deep. In at least one embodiment, the at least one fan within the housing can include three fans within the housing and configured to provide an air velocity within the housing of over 500 feet per minute. In at least one embodiment, a system can include a pump within the housing, the pump being coupled to the liquid delivery pipe and configured to supply over one pound per minute of liquid flow. In at least one embodiment, a system can include a secondary wetted media within the housing between the inlet wetted media and the at least one outlet droplet trapping media.

In at least one embodiment, the secondary wetted media can be spaced apart from the inlet wetted media by between 2 inches and 5 inches. In at least one embodiment, a system can include a secondary delivery pipe at least partially within the housing and configured to deliver liquid to the secondary wetted media. In at least one embodiment, the at least one outlet droplet trapping media can include a first outlet droplet trapping media and a second outlet droplet trapping media. In at least one embodiment, the first outlet droplet trapping media and the second outlet droplet trapping media are positioned at an angle relative to each other, the angle being from 20 degrees to 135 degrees.

In at least one embodiment, a data center humidification system can include a controller configured to monitor an inlet pressure at the inlet of the housing, monitor an inlet temperature at the inlet of the housing, monitor an inlet humidity at the inlet of the housing, monitor an outlet pressure at the outlet of the housing, monitor an outlet temperature at the outlet of the housing, monitor an outlet humidity at the outlet of the housing, control the at least one fan based on at least two of the group consisting of the inlet pressure, the inlet temperature, the inlet humidity, the outlet pressure, the outlet temperature, the outlet humidity, and provide at least one alarm based on at least one of the inlet pressure, the inlet temperature, the inlet humidity, the outlet pressure, the outlet temperature, the outlet humidity and a combination thereof.

In at least one embodiment, a data center humidification system can include a housing configured to be coupled to a server cabinet between the server cabinet and a return air duct of a cooling unit, the housing having an inlet for receiving warm air from the server cabinet and an outlet for ejecting humid air into the return air duct, an inlet wetted media within the housing proximate to the inlet, a liquid delivery pipe at least partially within the housing and configured to deliver liquid to the inlet wetted media, at least one outlet droplet trapping media within the housing proximate to the outlet, and at least one fan within the housing and configured to move air through the housing.

In at least one embodiment, the housing can be less than 74 inches tall, less than 21 inches wide, and less than 44 inches deep. In at least one embodiment, the at least one fan within the housing can include three fans within the housing and configured to provide an air velocity within the housing of over 500 feet per minute. In at least one embodiment, a system can include a pump within the housing, the pump being coupled to the liquid delivery pipe and configured to supply over one pound per minute of liquid flow. In at least one embodiment, a system can include a secondary wetted media within the housing between the inlet wetted media and the at least one outlet droplet trapping media.

In at least one embodiment, the secondary wetted media can be spaced apart from the inlet wetted media between 2 inches and 5 inches. In at least one embodiment, a system can include a secondary delivery pipe at least partially within the housing and configured to deliver liquid to the secondary wetted media. In at least one embodiment, the at least one outlet droplet trapping media can include a first outlet droplet trapping media and a second outlet droplet trapping media. In at least one embodiment, the first outlet droplet trapping media and the second outlet droplet trapping media are positioned at an angle to each other, the angle being from 20 degrees to 135 degrees.

In at least one embodiment, a system can include a controller configured to monitor an inlet pressure at the inlet of the housing, monitor an inlet temperature at the inlet of the housing, monitor an inlet humidity at the inlet of the housing, monitor an outlet pressure at the outlet of the housing, monitor an outlet temperature at the outlet of the housing, monitor an outlet humidity at the outlet of the housing, control the at least one fan based on at least two of the group consisting of the inlet pressure, the inlet temperature, the inlet humidity, the outlet pressure, the outlet temperature, the outlet humidity, and provide at least one alarm based on at least one of the inlet pressure, the inlet temperature, the inlet humidity, the outlet pressure, the outlet temperature, the outlet humidity and a combination thereof.

Other and further embodiments utilizing one or more aspects of the disclosure can be devised without departing from the spirit of Applicants' disclosure. For example, the devices, systems and methods can be implemented for data centers of numerous different types and sizes in numerous different industries. Further, the various methods and embodiments of the devices, systems and methods can be included in combination with each other to produce variations of the disclosed methods and embodiments. Discussion of singular elements can include plural elements and vice-versa. The order of steps can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions.

The inventions have been described in the context of preferred and other embodiments and not every embodiment of the inventions has been described. Obvious modifications and alterations to the described embodiments are available to those of ordinary skill in the art having the benefits of the present disclosure. The disclosed and undisclosed embodiments are not intended to limit or restrict the scope or applicability of the inventions conceived of by the Applicants, but rather, in conformity with the patent laws, Applicants intend to fully protect all such modifications and improvements that come within the scope or range of equivalents of the following claims.

What is claimed is:

1. A data center humidification system, comprising:
   a housing configured to be mounted within a server cabinet, the housing having an inlet for receiving warm air and an outlet for ejecting humid air;
   an inlet wetted media within the housing proximate to the inlet;
   a liquid delivery pipe at least partially within the housing and configured to deliver liquid to the inlet wetted media;
   at least one outlet droplet trapping media within the housing proximate to the outlet, wherein the at least one outlet droplet trapping media comprises a first outlet droplet trapping media and a second outlet droplet trapping media, and wherein the first outlet droplet trapping media and the second outlet droplet trapping media are positioned at an angle to each other; and
   at least one fan within the housing and configured to move air through the housing.

2. The system of claim 1, wherein the housing is less than 74 inches tall, less than 21 inches wide, and less than 44 inches deep.

3. The system of claim 1, wherein the at least one fan within the housing comprises three fans within the housing and configured to provide an air velocity within the housing of over 500 feet per minute.

4. The system of claim 1, further including a pump within the housing, the pump being coupled to the liquid delivery pipe and configured to supply over one pound per minute of liquid flow.

5. The system of claim 1, further including a secondary wetted media within the housing between the inlet wetted media and the at least one outlet droplet trapping media.

6. The system of claim 5, wherein the secondary wetted media is spaced apart from the inlet wetted media by between 2 inches and 5 inches.

7. The system of claim 5, further including a secondary delivery pipe at least partially within the housing and configured to deliver liquid to the secondary wetted media.

8. The system of claim 1, wherein the angle is from 20 degrees to 135 degrees.

9. The system of claim 1, further including a controller configured to:
   monitor an inlet pressure at the inlet of the housing;
   monitor an inlet temperature at the inlet of the housing;
   monitor an inlet humidity at the inlet of the housing;
   monitor an outlet pressure at the outlet of the housing;
   monitor an outlet temperature at the outlet of the housing;
   monitor an outlet humidity at the outlet of the housing;
   control the at least one fan based on at least two of the group consisting of the inlet pressure, the inlet temperature, the inlet humidity, the outlet pressure, the outlet temperature, the outlet humidity; and
   provide at least one alarm based on at least one of the inlet pressure, the inlet temperature, the inlet humidity, the outlet pressure, the outlet temperature, the outlet humidity and a combination thereof.

10. A data center humidification system, comprising:
    a housing configured to be coupled to a server cabinet between the server cabinet and a return air duct of a cooling unit, the housing having an inlet for receiving warm air from the server cabinet and an outlet for ejecting humid air into the return air duct;
    an inlet wetted media within the housing proximate to the inlet;
    a liquid delivery pipe at least partially within the housing and configured to deliver liquid to the inlet wetted media;
    at least one outlet droplet trapping media within the housing proximate to the outlet, wherein the at least one outlet droplet trapping media comprises a first outlet droplet trapping media and a second outlet droplet trapping media and wherein the first outlet droplet trapping media and the second outlet droplet trapping media are positioned at an angle to each other; and
    at least one fan within the housing and configured to move air through the housing.

11. The system of claim 10, wherein the housing is less than 74 inches tall, less than 21 inches wide, and less than 44 inches deep.

12. The system of claim 10, wherein the at least one fan within the housing comprises three fans within the housing configured to provide an air velocity within the housing of over 500 feet per minute.

13. The system of claim 10, further including a pump within the housing, the pump being coupled to the liquid delivery pipe and configured to supply over one pound per minute of liquid flow.

14. The system of claim 10, further including a secondary wetted media within the housing between the inlet wetted media and the at least one outlet droplet trapping media.

15. The system of claim 14, wherein the secondary wetted media is spaced apart from the inlet wetted media between 2 inches and 5 inches.

16. The system of claim 14, further including a secondary delivery pipe at least partially within the housing and configured to deliver liquid to the secondary wetted media.

17. The system of claim 10, wherein the angle is from 20 degrees to 135 degrees.

18. The system of claim 10, further including a controller configured to:
    monitor an inlet pressure at the inlet of the housing;
    monitor an inlet temperature at the inlet of the housing;
    monitor an inlet humidity at the inlet of the housing;
    monitor an outlet pressure at the outlet of the housing;
    monitor an outlet temperature at the outlet of the housing;
    monitor an outlet humidity at the outlet of the housing;
    control the at least one fan based on at least two of the group consisting of the inlet pressure, the inlet temperature, the inlet humidity, the outlet pressure, the outlet temperature, the outlet humidity; and
    provide at least one alarm based on at least one of the inlet pressure, the inlet temperature, the inlet humidity, the outlet pressure, the outlet temperature, the outlet humidity and a combination thereof.

19. A data center humidification system, comprising:
    a housing configured to be mounted within a server cabinet, the housing having an inlet for receiving warm air and an outlet for ejecting humid air;
    an inlet wetted media within the housing proximate to the inlet;
    a liquid delivery pipe at least partially within the housing and configured to deliver liquid to the inlet wetted media;
    a first outlet droplet trapping media within the housing proximate to the outlet;
    a second outlet droplet trapping media within the housing proximate to the outlet and positioned at an angle to the first outlet droplet trapping media; and at least one fan within the housing and configured to move air through the housing.

\* \* \* \* \*